United States Patent [19]

Kwon et al.

[11] Patent Number: 5,364,809

[45] Date of Patent: Nov. 15, 1994

[54] METHOD OF FABRICATING A CAPACITOR FOR A DYNAMIC RANDOM ACCESS MEMORY CELL

[75] Inventors: Oh-Hyun Kwon; Taek-Yong Jang; Joong-Hyun Shin; Kyoung-Seok Oh, all of Seoul, Rep. of Korea

[73] Assignee: SamSung Electronics Co., Ltd., Suwon, Rep. of Korea

[21] Appl. No.: 723,403

[22] Filed: Jul. 1, 1991

[30] Foreign Application Priority Data

May 23, 1991 [KR] Rep. of Korea ............. 1991-8366

[51] Int. Cl.$^5$ ............. H01L 21/70; H01L 27/00
[52] U.S. Cl. ............. 437/52; 437/60; 437/919
[58] Field of Search ............. 437/45, 60, 52, 43, 437/919; 352/23.6; 365/149, 150

[56] References Cited

U.S. PATENT DOCUMENTS

| 5,028,990 | 7/1991 | Kotaki et al. | 357/23.66 |
| 5,030,585 | 7/1991 | Gonzaler et al. | 357/23.6 |
| 5,047,826 | 9/1991 | Keller et al. | 357/51 |
| 5,126,280 | 6/1992 | Chan et al. | 437/60 |
| 5,185,282 | 2/1993 | Lee et al. | 437/47 |

FOREIGN PATENT DOCUMENTS

| 0286270 | 12/1987 | Japan | 357/23.6 |
| 0074752 | 3/1989 | Japan | 437/919 |
| 1-257365A | 10/1989 | Japan | . |
| 2-226761 | 9/1990 | Japan | 437/52 |
| 0275665 | 11/1990 | Japan | 365/150 |
| 3-64964 | 3/1991 | Japan | 437/52 |

Primary Examiner—Olik Chaudhuri
Assistant Examiner—H. Jey Tsai
Attorney, Agent, or Firm—Robert E. Bushnell

[57] ABSTRACT

A method of fabricating a multi-chamber type DRAM cell capacitor having high capacitance within a limited area. A first concave area (54) of the storage electrode (72) is formed by means of an oxide film (46) as a scarifying layer. An insulating spacer (58) is formed in the first concave area (54). Then, first and second conduction layers (48, 60) are formed on the substrate (26) and top portions of the conduction layers are removed consecutively, so as to form a capacitor having a plurality of concave areas.

38 Claims, 4 Drawing Sheets

METHOD OF FABRICATING A CAPACITOR FOR A DYNAMIC RANDOM ACCESS MEMORY CELL

BACKGROUND OF THE INVENTION

The present invention relates to a semiconductor memory device and, more particularly, to a method of fabricating a DRAM cell capacitor with high capacitance and a structure thereof.

As conventional semiconductor devices generally tend towards high chip-density, the areas occupied by the semiconductor device are reduced more and more. Accordingly, in manufacturing a DRAM cell which is comprised of one transistor and one capacitor, it is very important to increase the capacitance within a limited area.

Referring to FIGS. 1A to 1C, the manufacturing process of a conventional cylindrical capacitor is illustrated, which is disclosed in "Symposium On VLSI Technology", pp 13-14, published in 1990. In FIG. 1A, field oxide layer 4, gate 6, bit line 8, interlayer insulating layer 10 are formed on a semiconductor substrate 2 of a first conduction type. Polyimide 12 is spin-coated on the substrate 2 and thereby a reverse pattern of storage electrode is formed.

In FIG. 1B, polysilicon is deposited over the entire substrate 2 by CVD (Chemical Vapor Deposition) method to form a first conduction layer 14. Thereafter, photoresist 16 is covered over the surface of the first conduction layer 14 and then an etch-back process is performed until the first conduction layer 14 disposed on top of the polyimide 12 is exposed.

In FIG. 1C, exposed portions of the first conduction layer 14, photoresist 16 and polyimide 12 are consecutively removed so as to form a cylindrical storage electrode 18. Then, insulating layer 20 of $Ta_2O_5$ and plate electrode 22 of tungsten are formed on the substrate 2 to complete manufacturing of the capacitor. As disclosed above, in a conventional cylindrical capacitor, both ends of the storage electrode extend upwardly, perpendicular to the substrate so that the capacitor may be largely increased in capacitance.

It is, however, a drawback that the polyimide used as a scarifying layer for forming the storage electrode pattern may be weak in heat. Therefore, there is a problem in that the polyimide can be transformed or contaminated in a high temperature at which the polysilicon layer is deposited. Moreover, increasing the capacitance is limited, because only a single concave area is formed in the capacitor.

SUMMARY OF THE INVENTION

It is accordingly an object of the present invention to provide a method of fabricating a DRAM cell capacitor by using a scarifying layer, which is not transformed and contaminated by heat, for forming a storage pattern.

It is another object of the present invention to provide a method of fabricating a DRAM cell capacitor with high capacitance by employing an easy and reliable manufacturing process.

It is still another object of the present invention to provide a DRAM cell having a plurality of concave areas in a storage electrode.

In order to achieve the foregoing objects and other features of the invention, an embodiment of the invention uses an oxide layer, in place of the polyimide layer, as the scarifying layer for forming storage pattern.

According to another aspect of the invention, an embodiment of the invention forms a first concave area by using an oxide layer as a scarifying layer, and then forms an insulating spacer of the oxide layer in the first concave area. Thereafter, a conduction layer is formed and then the conduction layer formed on the concave area and the top of the conduction layer are removed, thereby forming a capacitor having a plurality of concave areas.

BRIEF DESCRIPTION OF THE DRAWINGS

For a better understanding of the present invention and to show the same may be carried into effect, reference will now be made, by way of example, to the accompanying diagrammatic drawings, in which.

DETAILED DESCRIPTION OF THE PREFERRED EMBODIMENTS

Figure 1A:
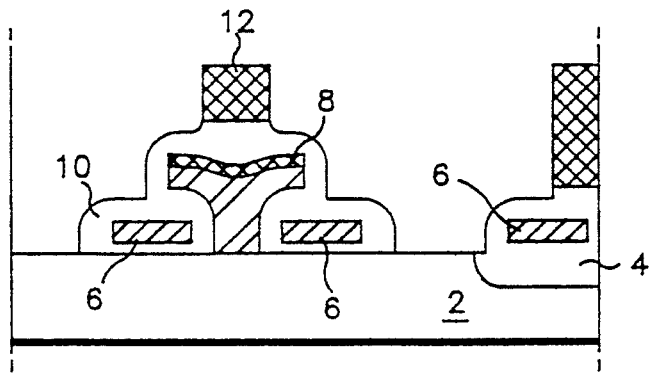
FIGS. 1A-1D show a manufacturing process of a DRAM cell capacitor according to a conventional method.
Figure 1B:
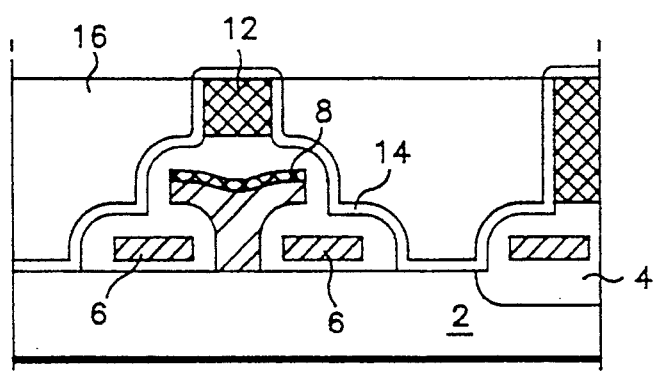
Figure 1C:
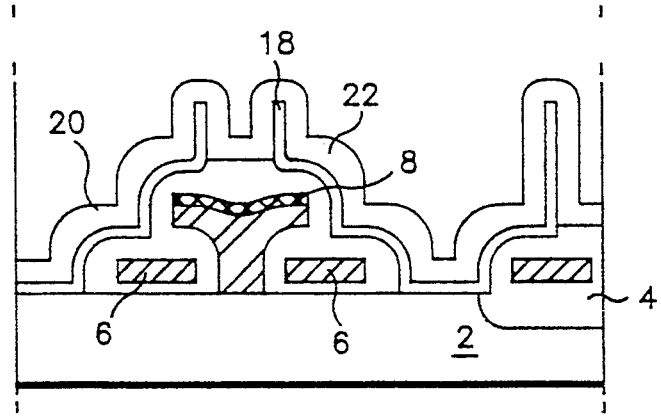
Figure 1D:
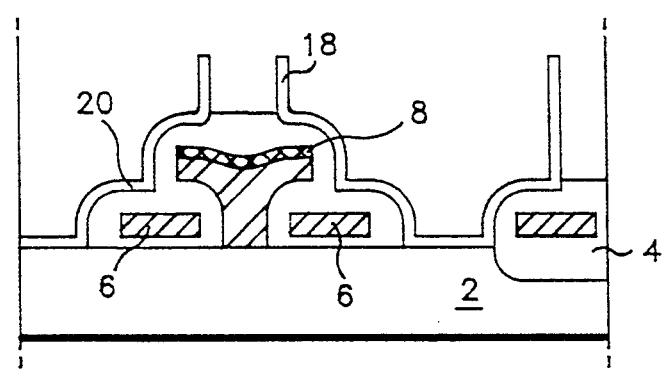
Figure 2:
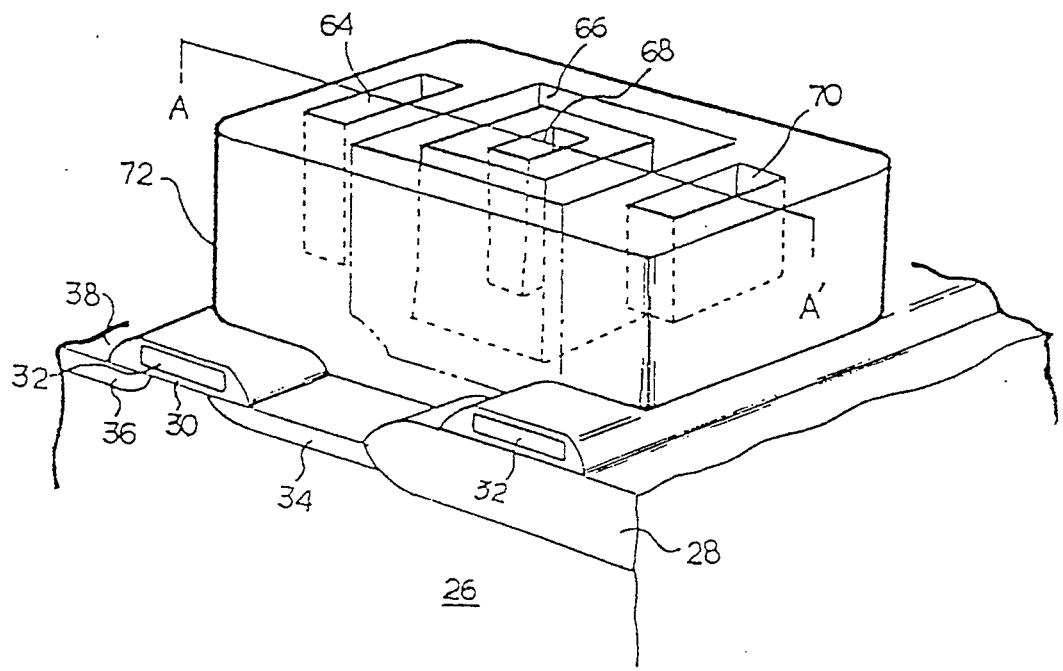
FIG. 2 shows a perspective view of a DRAM cell capacitor according to the present invention.

Referring to FIG. 2, a perspective view of the inventive DRAM cell capacitor, field oxide layer 28 is formed on semiconductor substrate 26 of a first conduction type. Source and drain regions 34, 36 of a second conduction type are separated with a specific distance by a channel region disposed therebetween. Gates 32 are formed over the field oxide layer 28 and the channel region. In addition, storage electrode 72 has a plurality of concave areas 64, 66, 68, 70 which are formed such that the source region 34 and the gates 32 adjacent to the source region are connected to the lower part of the storage electrode 72.

Figure 3:
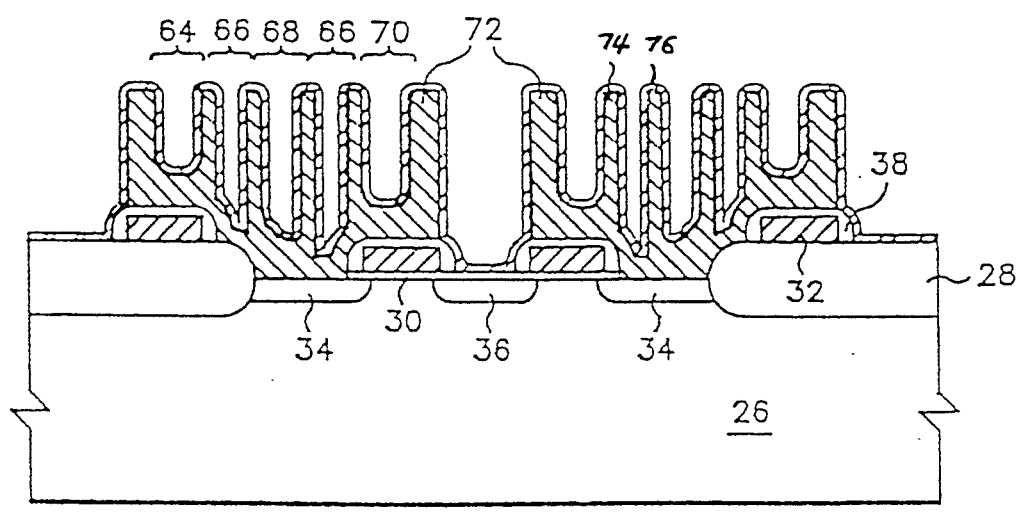
FIG. 3 shows a cross sectional view of the DRAM cell capacitor taken at line A—A' of FIG. 2.

Referring to FIG. 3, a cross sectional view of the inventive DRAM cell capacitor, the same reference numerals are used for the same parts or equivalent as shown in FIG. 2. It is noted, in the drawing, that two transistors and two capacitors are illustrated. Each capacitor has the storage electrode 72 having a plurality of concave areas. Furthermore, dielectric layer 74 and plate electrode 76 are deposited on the storage electrode 72.

Figure 4A:
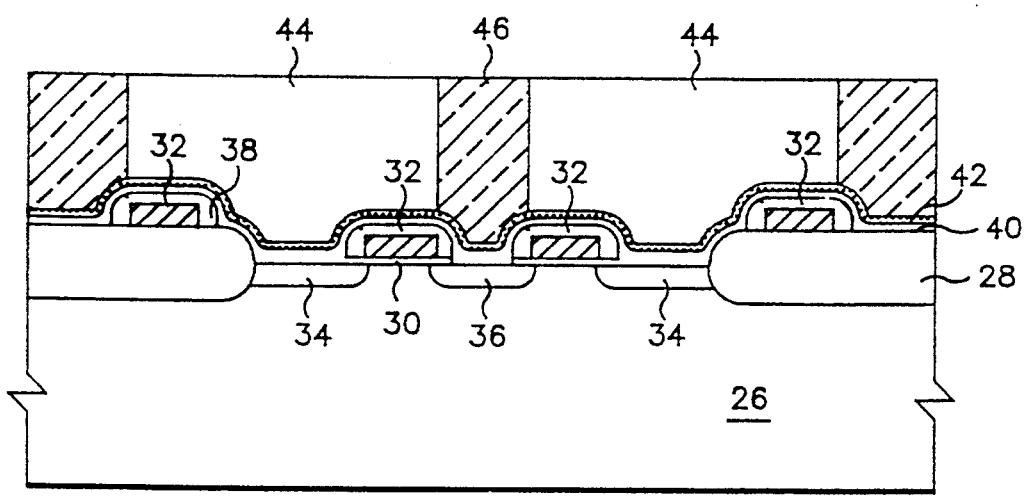
FIGS. 4A-4F show a manufacturing process of the DRAM cell capacitor according to the present invention.

Referring to FIGS. 4A-4F, a manufacturing process of the inventive DRAM cell capacitor is described, wherein the same reference numerals are used for the same parts or equivalent as shown in FIGS. 2 and 3. With reference to FIG. 4A, there is shown the semiconductor substrate 26 of a first conduction type on which the field oxide layer 28 in the thickness of 2,000 Å~3,000 Å, the gate oxide layer 30 in the thickness of 100 Å~200 Å, source 34 and drain 36 of a second conduction type separated by the channel region are formed. Then, the insulating spacer 38 is formed on the channel region, the gate 32 and the side walls of the gate 32 disposed on the field oxide layer 28. Thereafter, a first oxide layer 40 and nitride layer 42 are consecutively stacked on the above substrate. Thereafter, a first photoresist 44 is covered on the substrate 26 in the thickness of 0.5 μm~1 μm and the photoetching process is performed to have the first photoresist remain only in the region at which the storage electrode is to be formed. Between the first remaining photoresist patterns, a second field oxide layer 46 is filled, and the etch-back process is performed until the first photoresist 44 is entirely etched out. The second field oxide layer filled between the first photoresist patterns is replaceable with a nitride layer or SOG (Spin-On-Glass) layer.

Figure 4B:
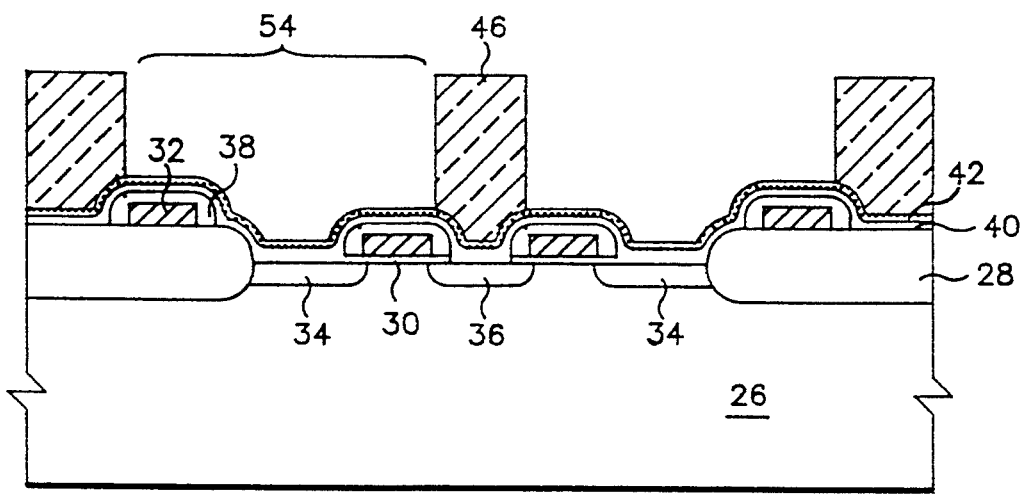

In FIG. 4B, the first photoresist 44 is removed to form a reverse pattern of the storage electrode in a first concave area, storage electrode region, 54. In the embodiment, the remaining walls of the second oxide layer 46 are scarifying layers for forming a storage electrode pattern.

Figure 4C:
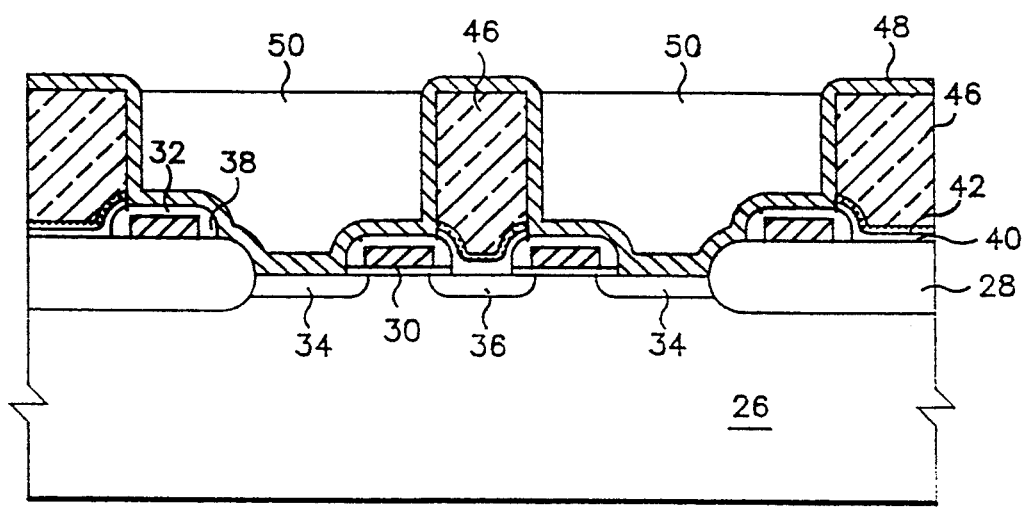

Referring to FIG. 4C, exposed portions of the nitride layer 42 and the first oxide layer 40 formed thereunder are removed to expose the surface of the source region 34. A first polysilicon layer 48 is then formed over the substrate 26 to be in contact with the exposed portion of the source region 34. Thickness of the first polysilicon layer 48 is preferably about 1,000 Å. Thereafter, a second photoresist 50 is covered over the substrate 26 and the etch-back process is performed until the first polysilicon layer disposed on top of the second oxide layer 46 is exposed.

Figure 4D:
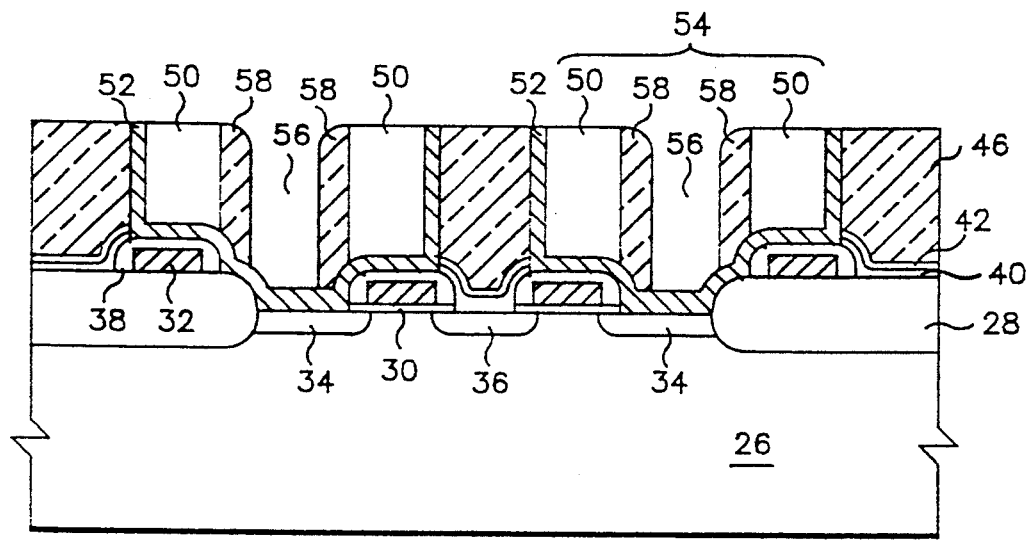

Referring to FIG. 4D, exposed portions of the first polysilicon layer 48 are removed to form a storage electrode 52 in the first concave area 54. The second photoresist 50 remaining in the center of the first concave area 54 is removed to form an opening 56 which has first and second side walls separated by a specific distance from the two facing walls of the first concave area 54. The opening 56 further includes third and fourth walls of the first polysilicon layer disposed between the first and second walls substantially perpendicularly thereto, both ends of the third and fourth walls being connected to front and rear ends of the first and second walls, respectively. A third oxide layer in the thickness of 1,500 Å is formed on the substrate 26 and then the etch-back process is performed to form, on the walls of the opening 56, the insulating spacer 58 made of the third oxide layer.

Figure 4E:
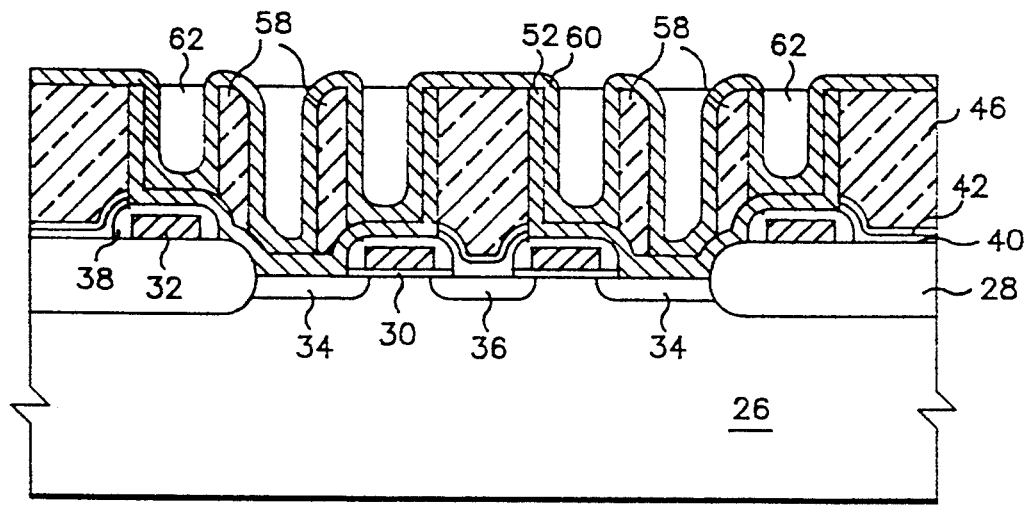

In FIG. 4E, the second photoresist 50 still remaining in the first concave area 54 is removed, and a second polysilicon layer 60 in the thickness of 500 Å~1,000 Å is formed on the substrate 26. A third photoresist 62 is covered over the substrate 26 and the etch-back process is performed until the second polysilicon layer 60 disposed on top of the second oxide layer 46 and the insulating spacer 58 are exposed.

Figure 4F:
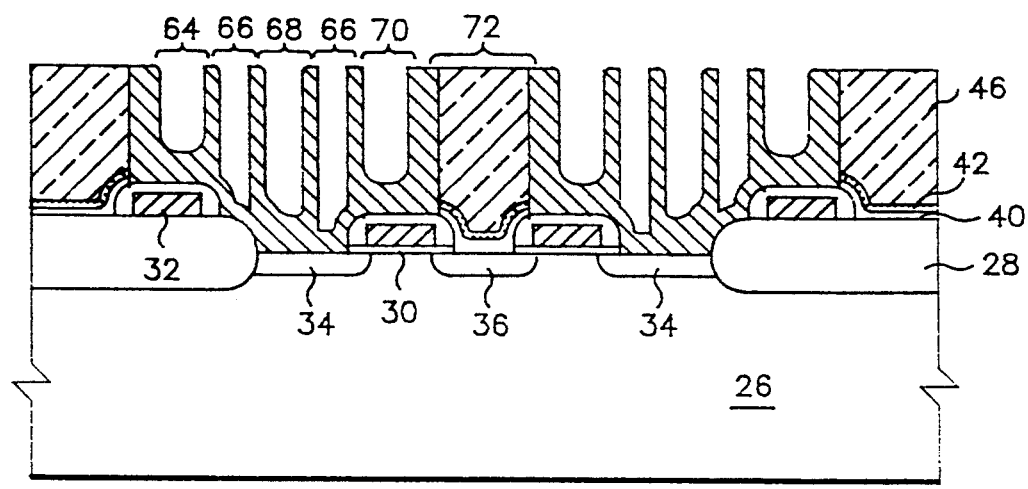

In FIG. 4F, the exposed portions of the second polysilicon layer 60 are removed, and consecutively the third photoresist 62 and the insulating spacer 58 made of the third oxide layer are removed to form the storage electrode 72 having a second to fifth concave area 64, 66, 68, and 70. Thereafter, the second oxide layer 46, the nitride layer 42 formed thereunder and the first oxide layer 40 are removed. Then, the dielectric layer 74 and plate electrode 76 are formed on the substrate 26 to complete manufacturing of a multi-chamber type capacitor having a plurality of concave areas. In this embodiment, the dielectric layer 74 is preferably any of $Ta_2O_5$, ONO layer or PZT layer, in the thickness of 30 Å~80 Å. Furthermore, the plate electrode 76 is 1,000 Å~3,000 Å thick.

As described heretofore, an embodiment of the present invention has the storage electrode 72 in which the left and right hand side walls 58 of the opening 56 are formed, with a specific distance therebetween, parallel to the corresponding side walls 52 of the first concave area 54, with a ring-like rectangular column concave 66 wrapping around a center concave area 68 of the first concave area 54 and with two concave areas 64, 70 being disposed symmetrically on the left and right hand sides thereof.

According to another embodiment of the present invention, however, the storage electrode may be formed such that four side walls of the opening 56 are formed with a specific distance therebetween, parallel to the corresponding side walls of the first concave area 54, with a first and second ring-like concave column wrapping around a center concave area 68 of the first concave area 54.

The inventive DRAM cell capacitor, as presented above, uses an oxide layer in place of the conventional polyimide as a scarifying layer in order to form a storage electrode pattern. Therefore, even if consecutive polysilicon deposition processes are performed at high temperature, the scarifying layer made of an oxide layer is not transformed or contaminated, so that a desired storage electrode pattern may be formed and further yield of the process may be improved.

Furthermore, the inventive DRAM cell capacitor has a plurality of concave areas formed in the first concave area by forming the insulating spacer in the storage electrode pattern, so that the capacitance thereof may be greatly increased in comparison with the conventional cylindrical capacitor. Accordingly, in the case of over 64 Mbit of high density semiconductor memory device, the inventive DRAM cell capacitor can obtain enough capacitance without increasing the area occupied by the capacitor.

What is claimed is:

1. A method of fabricating a capacitor for a dynamic random access memory cell comprising a transistor and said capacitor, said method comprising the steps of:

consecutively forming a first insulating layer, a second insulating layer, and a first photoresist over a semiconductor substrate having said transistor formed on said semiconductor substrate, and then selectively removing said first photoresist except for portions covering a storage electrode region;

filling a third insulating layer between the remaining portions of said first photoresist and then selectively removing said remaining portions of said first photoresist to form a first concave area circumscribed by said third insulating layer;

after selectively removing said remaining portions of said first photoresist, etching exposed portions of said first insulating layer and said second insulating layer to expose a surface of a diffusion region, and then forming a first conduction layer over said substrate;

after forming said first conduction layer, forming a second photoresist on said first conduction layer and then performing an etch-back process to only partially expose said first conduction layer so that said first conduction layer disposed on top of said third insulating layer is exposed;

removing exposed portions of said first conduction layer to form a storage electrode;

removing exposed portions of said second photoresist to form an opening having first and second sidewalls, then forming a fourth insulating layer over said substrate and performing said etch-back process on said fourth insulating layer to form an insulating spacer layer on inner portions of said first and second sidewalls;

after forming said insulating spacer layer, removing remaining portions of said second photoresist, and then forming a second conduction layer over said substrate; and after forming said second conduction layer, forming a third photoresist on said second conduction layer and then performing said etch-back process on said third photoresist to expose said second conduction layer and said insulating spacer layer.

2. A method as claimed in claim 1, wherein said first and fourth insulating layers are oxide layers.

3. A method as claimed in claim 1, wherein said second insulating layer is a nitride layer.

4. A method as claimed in claim 1, wherein said third insulating layer is one of an oxide layer, a nitride layer and Spin-On-Glass layer.

5. A method as claimed in claim 1, wherein said first and second conduction layers are polysilicon layers.

6. A method of fabricating a capacitor for a dynamic random access memory cell comprising a transistor and said capacitor, said method comprising the steps of:

forming a first concave area circumscribed by oxide walls;

forming, in said first concave area, a first conduction layer in contact with a diffusion region of a substrate;

after forming said first conduction layer, forming a first photoresist on said first conduction layer and performing a first etch-back process to only partially expose said first conduction layer so that said first conduction layer formed on a top of said oxide walls is exposed;

after performing said first etch-back process, removing exposed portions of said first conduction layer and then etching a portion of said first photoresist remaining in said first concave area until said first conduction layer disposed on top of said diffusion region is exposed to thereby form an opening, then forming on inner walls of said opening an insulating spacer layer;

after forming said insulating spacer layer, removing remaining portions of said first photoresist, and then forming a second conduction layer over said substrate;

after forming said second conduction layer, forming a second photoresist on said second conduction layer and then performing a second etch-back process to only partially expose said second conduction layer so that said second conduction layer disposed on top of said oxide walls and said insulating spacer layer are exposed; and after performing said second etch-back process, removing exposed portions of said second conduction layer and then removing said second photoresist and said insulating spacer layer so as to form a storage electrode having a plurality of convolutions in said first concave area.

7. A method as claimed in claim 6, wherein said opening has a first wall and a second wall each being separated from each other and each being parallel to a first side wall and a second side wall of said first concave area, and a third wall and a fourth wall of said opening being comprised of said first conduction layer and disposed between said first wall and said second wall.

8. A method as claimed in claim 6, wherein said opening comprises four walls separated from the corresponding walls of said first concave area.

9. A method as claimed in claim 6, wherein said first conduction layer is a polysilicon layer.

10. A method as claimed in claim 6, wherein said second conduction layer is a polysilicon layer.

11. A method as claimed in claim 6, wherein said insulating spacer layer is an oxide layer.

12. A method as claimed in claim 6, further comprising the step of forming first and second insulating layers on said substrate prior to forming said first concave area.

13. A method as claimed in claim 12, wherein said first insulating layer is an oxide layer.

14. A method as claimed in claim 13, wherein said second insulating layer is a nitride layer.

15. A method of fabricating a dynamic random access memory cell, said method comprising:

forming a first field oxide layer, a gate oxide layer, diffusion regions of a substrate, a first gate, and insulating spacers for said first gate and said second gate, and then forming a first insulating layer over said substrate;

forming and etching a first photoresist so remaining portions of said first photoresist are disposed over said first gate, and a portion of said diffusion regions;

after forming and etching said first photoresist, filling in a second insulating layer between said remaining portions of said first photoresist;

after filling in said second insulating layer, etching said first photoresist again to form a pattern of a storage capacitor electrode, and then removing exposed portions of said first insulating layer;

after removing said exposed portions of said first insulating layer, forming a first conductive layer over said substrate;

forming and etching back a second photoresist to only partially expose said first conductive layer so that said first conductive layer on a top of said second insulating layer is exposed and then removing exposed portions of said first conductive layer;

after removing exposed portions of said first conductive layer, forming an opening in said second photoresist over said portion of said diffusion regions, and then forming an insulating spacer layer on side walls of said opening;

after forming said an insulating spacer layer, forming a second conductive layer over said substrate and then forming and etching back a third photoresist to only partially expose said second conductive layer so that portions of said second conductive layer disposed on said top of said second insulating layer and a top of said insulating spacer layer are exposed;

after exposing portions of said second conductive layer, removing exposed portions of said second conductive layer and then removing said insulating spacer layer; and after removing said insulating spacer layer, consecutively forming a dielectric layer and a plate electrode layer over said substrate.

16. A method of fabricating a dynamic random access memory cell as claimed in claim 15, wherein said second insulating layer is silicon oxide.

17. A method of fabricating a dynamic random access memory cell as claimed in claim 15, wherein said second insulating layer is one of nitride and spin-on-glass.

18. A method of fabricating a dynamic random access memory cell as claimed in claim 15, wherein said first conductive layer is polysilicon.

19. A method of fabricating a dynamic random access memory cell as claimed in claim 15, wherein side walls of said second insulating layer are scarifying layers for forming a storage electrode pattern.

20. A method of fabricating a dynamic random access memory cell as claimed in claim 15, wherein said insulating spacer layer is silicon oxide.

21. A method of fabricating a dynamic random access memory cell as claimed in claim 15, wherein before forming said dielectric layer and said plate electrode layer and after removing said insulating spacer layer, said second insulating layer is removed.

22. A method of fabricating a dynamic random access memory cell as claimed in claim 15, wherein said dielectric layer is one of $Ta_2O_5$, ONO and PZT.

23. A method of fabricating a dynamic random access memory cell as claimed in claim 15, wherein said first insulating layer comprises a silicon oxide layer and a nitride layer.

24. A method of fabricating a capacitor of a dynamic random access memory cell, said method comprising:
   forming an insulating layer over a substrate;
   forming a storage capacitor electrode of a conductive layer including:
      an outer annular projection projecting vertically from said substrate and having inner side walls and outer side walls;
      two lateral annular projections each projectioning vertically from said substrate, each one of said two lateral annular projections having inner side walls and outer side walls, and each one of said two lateral annular projections being only partially coextensive with a different portion of said outer annular projection; and
      an inner annular projection projecting vertically from said substrate, having inner side walls and outer side walls, and concentrically positioned within said outer annular projection, forming said storage capacitor electrode further comprising the steps of:
   forming a patterning layer serving as a form for an outer periphery of said storage capacitor electrode;
   forming a first portion of said conductive layer over a top surface of said substrate;
   forming and etching back a first photoresist to partially expose said first portion of said conductive layer so that said first portion of first conductive layer on a top of said patterning layer is exposed, and then removing only exposed portions of said conductive layer;
   forming an opening at a center portion of said storage capacitor electrode in a first photoresist to expose a first portion of said conductive layer and then forming an insulating spacer layer on side walls of said opening;
   removing said first photoresist and forming a second portion of said conductive layer over a top surface of said substrate and then forming and etching back a second photoresist to partially expose said second portion of said conductive layer so that conductive layer disposed on a top of a patterning layer and a top of said insulating spacer layer is exposed;
   removing exposed portions of said second portion of said conductive layer and then removing said insulating spacer layer; and
   consecutively forming a dielectric layer and a plate electrode layer on said inner side walls and said outer side walls of said outer annular projection, said inner side walls and said outer side walls of said two lateral annular projections, and said inner side walls and said outer side walls of said inner annular projection of said conductive layer.

25. A method of fabricating a capacitor as claimed in claim 24, wherein said insulating layer comprises a nitride layer formed over a silicon oxide layer.

26. A method of fabricating a capacitor of a dynamic random access memory cell, said method comprising:
   forming an insulating layer over a substrate;
   forming a storage capacitor electrode of a conductive layer including an outer annular projection projecting vertically from said substrate and having inner side walls and outer side walls; and an inner annular projection projecting vertically from said substrate, having inner side walls and outer side walls, and concentrically positioned within said outer annular projection, wherein forming said storage capacitor electrode comprises:
   forming a patterning layer serving as a form for an outer periphery of said storage capacitor electrode;
   forming a first portion of said conductive layer over a top surface of said substrate:
   forming and etching back a first photoresist to partially expose said first portion of said conductive layer so that said first portion of first conductive layer on a top of said patterning layer is exposed, and then removing only exposed portions of said conductive layer;
   forming an opening in said first photoresist to expose a remaining portion of said first portion of said conductive layer and then forming an insulating spacer layer on side walls of said opening;
   removing said first photoresist and forming a second portion of said conductive layer over a top surface of said substrate and then forming and etching back a second photoresist to partially expose said second portion of said conductive layer so that said conductive layer disposed on said top of said patterning layer and a top of said insulating spacer layer are exposed; and
   removing exposed portions of said second portion of said conductive layer and then removing said insulating spacer layer;
   consecutively forming a dielectric layer and a plate electrode layer on both said inner side walls and said outer side walls of said outer annular projection and both said inner side walls and said outer side walls of said inner annular projection of said conductive layer.

27. A method of fabricating a capacitor as claimed in claim 26, wherein inner walls of a void created by the removal of said insulating spacer layer define said outer side walls of said inner annular projection and outer walls of said void define said inner side walls of said outer annular projection.

28. A method of fabricating a capacitor as claimed in claim 24, wherein said patterning layer is one of a second field oxide layer, a nitride layer, or a spin-on-glass layer.

29. A method of fabricating a capacitor as claimed in claim 24, wherein said patterning layer is formed by etching a patterning photoresist so remaining portions of said patterning photoresist are positioned to occupy a volumetric region where said capacitor is to be formed, and then filling in said patterning layer between said remaining portions of said patterning photoresist.

30. A method of fabricating a capacitor as claimed in claim 6, wherein said storage electrode includes an outer annular projection and an inner annular projection concentrically positioned within said outer annular projection and a dielectric layer and a plate electrode layer are formed on both inner and outer side walls of both of said outer annular projection and said inner annular projection of said conductive layer.

31. A method of fabricating a capacitor as claimed in claim 30, wherein inner walls of a void created by the removal of said insulating spacer layer define said outer side walls of said inner annular projection and outer walls of said void define said inner side walls of said outer annular projection.

32. A method of fabricating an electrode of a capacitor, said method comprising:
forming a first field oxide layer, a gate oxide layer, diffusion regions of a substrate, a first gate, and insulating spacers for said first gate and said second gate, and then forming a first insulating layer over said substrate;
forming and etching a first photoresist so remaining portions of said first photoresist are disposed over said first gate, and a portion of said diffusion regions;
filling in a second insulating layer between said remaining portions of said first photoresist;
etching said first photoresist again to form a pattern of a storage capacitor electrode, and then removing exposed portions of said first insulating layer;
forming a first conductive layer over said substrate;
forming and etching back a second photoresist to only partially expose said first conductive layer so that said first conductive layer on a top of said second insulating layer is exposed and then removing exposed portions of said first conductive layer;
forming an opening in said second photoresist over said portion of said diffusion regions, and then forming an insulating spacer layer on side walls of said opening;
forming a second conductive layer over said substrate and then forming and etching back a third photoresist to only partially expose said second conductive layer so that portions of said second conductive layer disposed on said top of said second insulating layer and a top of said insulating spacer layer are exposed; and
removing exposed portions of said second conductive layer and then removing said insulating spacer layer.

33. A method of fabricating a capacitor as claimed in claim 24, wherein said step of consecutively forming said dielectric layer and said plate electrode layer further comprises forming said dielectric layer and said plate electrode layer on both inner and outer walls of said first lateral annular projection and both inner and outer walls of said second lateral annular projection.

34. A method as claimed in claim 1, further comprising removing said third insulating layer after said removal of said exposed portions of said first conduction layer.

35. A method as claimed in claim 1, further comprising:
after said removal of said exposed portions of said first conduction layer, only partially removing said second photoresist by etching a portion of said second photoresist remaining in said first concave area until said first conduction layer disposed on top of said diffusion region is exposed to thereby form an opening, then forming on inner walls of said opening an insulating spacer layer;
after forming said insulating spacer layer, removing remaining portions of said second photoresist, and then forming a second conduction layer over said substrate;
after forming said second conduction layer, forming a third photoresist on said second conduction layer and then performing an etch-back process to only partially expose said second conduction layer so that said second conduction layer disposed on top of said insulating spacer layer is exposed; and
after performing said etch-back process partially exposing said second conduction layer, removing exposed portions of said second conduction layer and then removing said third photoresist and said insulating spacer layer so as to form said storage electrode having a plurality of convolutions in said first concave area.

36. A method of fabricating a capacitor as claimed in claim 24, wherein inner walls of a void created by the removal of said insulating spacer layer define said outer side walls of said inner annular projection and outer walls of said void define said inner side walls of said outer annular projection.

37. A method as claimed in claim 1, wherein said first insulating layer is an oxide layer and said second insulating layer is a nitride layer.

38. A method as claimed in claim 36, further comprising:
after said removal of said exposed portions of said first conduction layer, only partially removing said second photoresist by etching a portion of said second photoresist remaining in said first concave area to form an opening through to said first conduction layer in a center portion of said first concave area, then forming on inner walls of said opening an insulating spacer layer;
after forming said insulating spacer layer, removing remaining portions of said second photoresist, and then forming a second conduction layer over said substrate;
after forming said second conduction layer, forming a third photoresist on said second conduction layer and then performing an etch-back process to only partially expose said second conduction layer so that said second conduction layer disposed on top of said insulating spacer layer is exposed; and
after performing said etch-back process partially exposing said second conduction layer, removing exposed portions of said second conduction layer and then removing said third photoresist and said insulating spacer layer so as to form said storage electrode having a plurality of convolutions in said first concave area.

* * * * *